United States Patent
Prentice (10) Patent No.: US 10,071,393 B2
(45) Date of Patent: Sep. 11, 2018

(54) METHOD OF DISPENSING MATERIAL ON A SUBSTRATE WITH A SOLENOID VALVE OF A PNEUMATICALLY-DRIVEN DISPENSING UNIT

(71) Applicant: Illinois Tool Works Inc., Glenview, IL (US)

(72) Inventor: Thomas C. Prentice, Westford, MA (US)

(73) Assignee: Illinois Tool Works Inc., Glenview, IL (US)

(*) Notice: Subject to any disclaimer, the term of this patent is extended or adjusted under 35 U.S.C. 154(b) by 289 days.

(21) Appl. No.: 15/153,178

(22) Filed: May 12, 2016

(65) Prior Publication Data

US 2017/0326577 A1    Nov. 16, 2017

(51) Int. Cl.
| | | |
|---|---|---|
| *H01H 47/00* | (2006.01) | |
| *B05C 5/02* | (2006.01) | |
| *F16K 31/06* | (2006.01) | |
| *H01L 21/02* | (2006.01) | |
| *H01L 21/288* | (2006.01) | |
| *H01L 21/56* | (2006.01) | |
| *H05K 3/12* | (2006.01) | |
| *B05C 11/10* | (2006.01) | |

(52) U.S. Cl.
CPC .............. *B05C 5/0225* (2013.01); *B05C 5/02* (2013.01); *B05C 11/1002* (2013.01); *F16K 31/0675* (2013.01); *H01L 21/02282* (2013.01); *H01L 21/288* (2013.01); *H01L 21/56* (2013.01); *H05K 3/12* (2013.01); *H05K 2203/0736* (2013.01); *H05K 2203/1305* (2013.01)

(58) Field of Classification Search
CPC .................................................... B05C 5/0225
See application file for complete search history.

(56) References Cited

U.S. PATENT DOCUMENTS 3,116,441 A    12/1963  Gieffers
3,579,052 A     5/1971  Kato et al.
(Continued)

FOREIGN PATENT DOCUMENTS

EP    0080795 B1    1/1987

OTHER PUBLICATIONS

International Search Report and Written Opinion of the ISA for related PCT application (PCT/US2017/031355), dated Sep. 21, 2017.

*Primary Examiner* — Stephen W Jackson
(74) *Attorney, Agent, or Firm* — Lando & Anastasi, LLP (57) ABSTRACT

A method of controlling a dispensing unit is used to dispense material on a substrate. The method includes connecting a solenoid coil of a pneumatically-driven pump to an amplifier output of a dispensing system, and driving the solenoid coil with the amplifier to a cause the pneumatically-driven pump to dispense material on a substrate. The method further may include commanding an idle current to flow in the solenoid coil during periods of inactivity. The idle current may be sufficient to cause warming of the solenoid coil, yet not sufficient to activate the solenoid to an engaged position. The method further may include commanding a first current level to flow in the solenoid coil to rapidly activate the solenoid, and commanding a second current level to flow in the solenoid coil after the solenoid is activated.

11 Claims, 5 Drawing Sheets

(56) References Cited

U.S. PATENT DOCUMENTS

| | | | |
|---|---|---|---|
| 4,697,619 A * | 10/1987 | Tiefenthaler | F16K 31/42 137/613 |
| 5,134,961 A | 8/1992 | Giles et al. | |
| 5,152,266 A | 10/1992 | Sekiguchi et al. | |
| 5,277,333 A | 1/1994 | Shimano | |
| 5,422,780 A | 6/1995 | Lignar | |
| 5,476,111 A * | 12/1995 | Andersen | B29C 31/00 134/58 R |
| 5,747,102 A | 5/1998 | Smith et al. | |
| 6,735,069 B2 | 5/2004 | Ehara | |
| 7,161,787 B2 | 1/2007 | Joens | |
| 7,740,225 B1 | 6/2010 | Estelle | |
| 7,746,620 B2 | 6/2010 | Bedingfield | |
| 8,339,762 B2 | 12/2012 | North | |
| 2003/0140898 A1 | 7/2003 | Xu | |

\* cited by examiner

METHOD OF DISPENSING MATERIAL ON A SUBSTRATE WITH A SOLENOID VALVE OF A PNEUMATICALLY-DRIVEN DISPENSING UNIT

RELATED APPLICATION

This application relates to U.S. patent application Ser. No. 15/153,168 entitled SYSTEM OF DISPENSING MATERIAL ON A SUBSTRATE WITH A SOLENOID VALVE OF A PNEUMATICALLY-DRIVEN DISPENSING UNIT, by Scott A. Reid, Thomas C. Prentice and Patsy A. Mattero, filed on even date herewith, which is incorporated herein by reference in its entirety for all purposes.

BACKGROUND OF THE DISCLOSURE

1. Field of the Disclosure

This disclosure relates generally to apparatus and methods for dispensing a viscous material on a substrate, such as a printed circuit board.

2. Discussion of Related Art

Viscous material dispensers having dispensing pumps for dispensing electronic materials operate in a variety of manners. Some well-known dispensing pumps use servo motors to drive a rotary auger, while some dispensing pumps use linear servo motors to drive a piston. Other dispensing pumps do not use an electric servo motor, but instead rely on other means for actuation. One such dispensing pump, which is disclosed in U.S. Pat. No. 5,747,102 Smith et al., includes a dispensing valve or unit that operates by moving a piston away from a seat using pneumatic pressure, thereby compressing a spring, and then releasing the pneumatic pressure to allow the spring to accelerate the piston back against the seat. With this dispensing unit, a droplet of material is forced out of an orifice at the seat as the piston contacts the seat. In such a dispensing unit, a solenoid valve is typically used to control the flow of air (or other gas) into and out of the piston chamber.

It is well known in the dispensing industry that a dispenser will respond differently when cycled one drop at a time as compared to the response when it is cycled repeatedly to produce a periodic series of drops in rapid succession. In particular, it is well known though not well understood that the first drop or even the first few initial drops in a periodic series of drops may differ from the balance of the drops in the periodic series. For example, the initial drops may contain a lesser mass of material than subsequently deposited drops.

Figure 1:
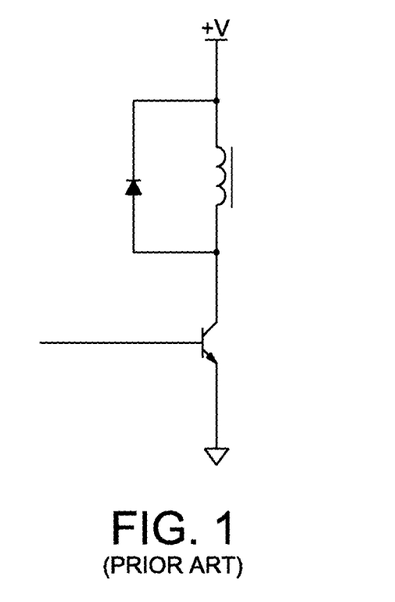
FIG. 1 is a schematic view of a prior art bipolar junction transistor (BJT) to switch current in a solenoid coil.
Figure 2:
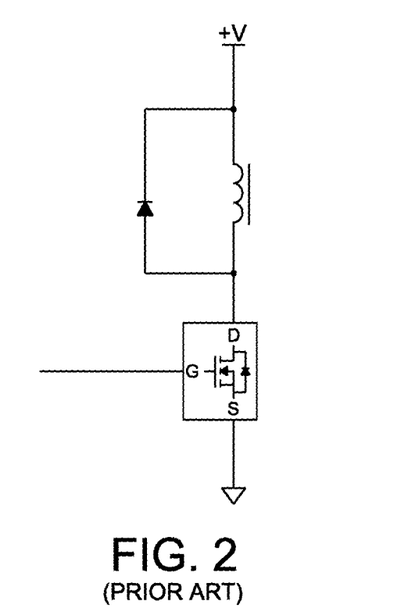
FIG. 2 is a schematic view of a field effect transistor (FET) to switch current in a solenoid coil.

FIGS. 1 and 2 illustrate two known solenoid drive circuits used to energize a coil. Prior art solenoid drive circuits generally use an on/off drive circuit to energize the coil. Some prior art circuits (see U.S. Pat. No. 3,116,441 to Gieffers) have improved on the simple on or off states by adding another discrete level of drive voltage (or current). This secondary drive level is utilized to reduce the current needed to maintain the coil in the energized position at a level less than that used to rapidly transition the solenoid from the un-energized to the actuated position (i.e., a holding current that is lower than the pull-in current). This lower drive level serves to save energy and reduce coil heating when compared with the simpler on/off drive circuits, and may improve the speed of operation by minimizing the time required for the solenoid field to collapse when the solenoid is turned off.

SUMMARY OF THE DISCLOSURE

One aspect of the present disclosure is directed to a method of controlling a dispensing unit used to dispense material on a substrate. In one embodiment, the method comprises: connecting a solenoid coil of a pneumatically-driven pump to an amplifier output of a dispensing system; and driving the solenoid coil with the amplifier to a cause the pneumatically-driven pump to dispense material on a substrate.

Embodiments of the method further may include commanding an idle current to flow in the solenoid coil during periods of inactivity. The idle current may be sufficient to cause warming of the solenoid coil, yet not sufficient to activate the solenoid to an engaged position. The method further may include commanding a first current level to flow in the solenoid coil to rapidly activate the solenoid, and commanding a second current level to flow in the solenoid coil after the solenoid is activated. The second current level may be sufficient to maintain the solenoid in the activated state. The second current level may be less than the first current level. The method further may include commanding a third current level to flow in the solenoid coil. The third current level may be of opposite polarity than the second current level and of a magnitude sufficiently small so as not to cause the solenoid to activate. The method further may include commanding an idle current to flow in the solenoid coil during periods of inactivity. The idle current may be sufficient to cause warming of the solenoid coil, yet not sufficient to activate the solenoid to an engaged position. The dispensing unit may be configured to dispense viscous material on an electronic substrate.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Various embodiments of the present disclosure are directed to viscous material dispensing systems, devices including dispensing systems. Embodiments disclosed herein are directed to techniques for dispensing material on an electronic substrate by a dispensing pump that is configured to control a current flowing in a coil of a pneumatic solenoid valve at a desired level.

Figure 3:
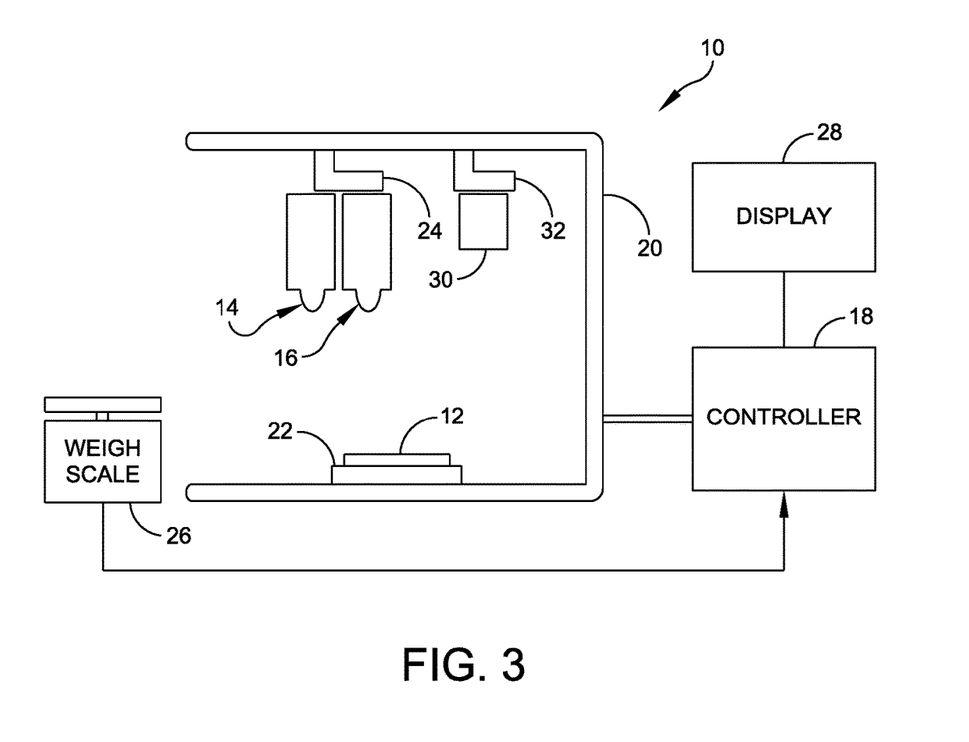
FIG. 3 is a schematic view of a dispenser of an embodiment of the present disclosure.

FIG. 3 schematically illustrates a dispenser, generally indicated at 10, according to one embodiment of the present disclosure. The dispenser 10 is used to dispense a viscous material (e.g., an adhesive, encapsulant, epoxy, solder paste, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications or for applying conductive inks. It should be understood that references to viscous or semi-viscous materials, as used herein, are exemplary and intended to be non-limiting. The dispenser 10 includes first and second dispensing units, generally indicated at 14 and 16, respectively, and a controller 18 to control the operation of the dispenser. It should be understood that dispensing units also may be referred to herein as dispensing pumps and/or dispensing heads. Although two dispensing units are shown, it should be understood that one or more dispensing units may be provided.

The dispenser 10 may also include a frame 20 having a base or support 22 for supporting the substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispenser 10 to control loading and unloading of substrates to and from the dispenser. The gantry 24 can be moved using motors under the control of the controller 18 to position the dispensing units 14, 16 at predetermined locations over the substrate. The dispenser 10 may include a display unit 28 connected to the controller 18 for displaying various information to an operator. There may be an optional second controller for controlling the dispensing units. Also, each dispensing unit 14, 16 can be configured with a z-axis sensor to detect a height at which the dispensing unit is disposed above the electronic substrate 12 or above a feature mounted on the electronic substrate. The z-axis sensor is coupled to the controller 18 to relay information obtained by the sensor to the controller.

Prior to performing a dispensing operation, as described above, the substrate, e.g., the printed circuit board, must be aligned or otherwise in registration with a dispenser of the dispensing system. The dispenser further includes a vision system 30, which, in one embodiment, is coupled to a vision system gantry 32 movably coupled to the frame 20 for supporting and moving the vision system. This embodiment is also illustrated in FIG. 3. In another embodiment, the vision system 30 may be provided on the dispensing unit gantry 24. As described, the vision system 30 is employed to verify the location of landmarks, known as fiducials, or components on the substrate. Once located, the controller can be programmed to manipulate the movement of one or more of the dispensing units 14, 16 to dispense material on the electronic substrate.

Systems and methods of the present disclosure are directed to dispensing material onto a substrate, e.g., a circuit board. The description of the systems and methods provided herein reference exemplary electronic substrates 12 (e.g., printed circuit boards), which are supported on the support 22 of the dispenser 10. In one embodiment, the dispense operation is controlled by the controller 18, which may include a computer system configured to control material dispensers. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

Embodiments of the present disclosure are directed to a dispensing unit, such as dispensing units 14, 16, having an actuator control circuit configured to control a current flow in a coil of a pneumatic solenoid valve at (virtually) any desired level. Specifically, with reference to FIG. 4, an actuator drive circuit, generally indicated at 40, is configured to drive the current in a solenoid coil 42 of a solenoid valve, generally indicated at 44, with a PWM transconductance amplifier 46, which uses an input voltage to command and control a current in a load. Although a transconductance amplifier 46 is shown and described herein, other types of amplifiers may be used to achieve the results achieved with the transconductance amplifier. In one embodiment, the solenoid coil 42 of the solenoid valve 44 is connected as a load for the amplifier 46, and is connected either directly to the amplifier or through intermediate filter components 48, such as high frequency choke inductors. In other words, the current control is part of an analog control system, rather than the digital (on/off) control systems typically found other coil drive systems, and this additional control is utilized to better achieve the overall system objectives. For example, the benefits of a reduced holding voltage may also be realized with the analog amplifier control, without requiring any special or additional circuitry.

Figure 4:
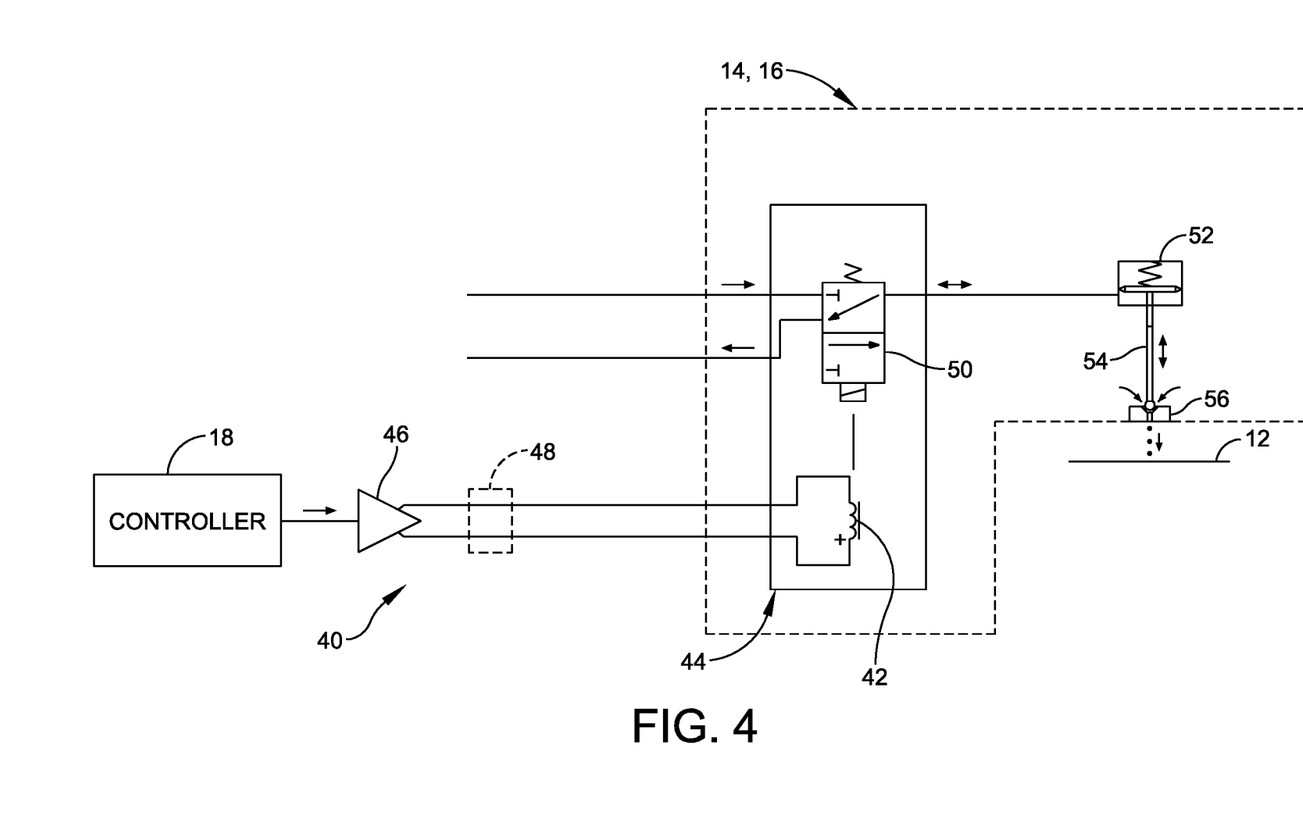
FIG. 4 is a schematic view of an actuator drive circuit having an amplifier to drive current in a solenoid coil.

As shown, the amplifier 46 is coupled to the controller 18 to control the operation of the actuator control circuit 40, and more particularly the solenoid valve 44, which is comprised of the solenoid coil 42 and a pneumatic valve 50, with the solenoid valve being configured to drive the operation of the dispensing unit 14, 16. The solenoid valve 44 is configured to control the flow of air to an air cylinder 52 coupled to a piston 54, which is pneumatically driven from a lower (first) position to an upper (second) position. The piston 54 engages a valve seat 56 to dispense material on the substrate 12. Specifically, the solenoid valve 44 is configured to control air flow to and from the air cylinder 52 and the piston 54. The controller 18, which is coupled to the amplifier 46, is configured to generate a command signal to the amplifier to control current in the solenoid coil 42.

By providing full analog control over a current waveform of the solenoid coil 42, many characteristics of the solenoid valve 44 may be modified or tailored to better meet the particular needs of dispensing systems. For example, maintaining the solenoid coil 42 in the on state with a reduced holding current can minimize the time required for the solenoid field to collapse when the solenoid valve 44 is turned off. For the actuator control circuit 40 of embodiments of the present disclosure, the time required for the magnetic field of the solenoid coil 42 to collapse (i.e., to turn the solenoid off) can be further shortened by commanding a slightly negative current for a very short period of time (a few hundred microseconds, for example) to more rapidly and actively drive the field strength to a near zero (off state) condition.

Another benefit of the actuator drive circuit 40 relates to the fact that the time required for the current to build up in the coil or other inductor is inversely proportional to the available supply voltage (di/dt=V/L). In on/off prior art systems, the resistance of the coil winding and the rated supply voltage are chosen such that power dissipated in the solenoid coil 42 will be within a rating of the coil. Using the current control amplifier 46 permits the use of a supply voltage higher than the rated voltage of the solenoid coil 42. For example, driving a 24V coil from a 48V supply (rather than from a 24V supply) might permit the current in the solenoid coil 42 to build twice as rapidly, but the current will build to twice the rated current, and thus the power dissipation would be four times the nominal value. By using the current control amplifier 46, the desired current can be commanded at the full rated value, and the amplifier can use the full available supply voltage to rapidly build the current in the solenoid coil 42, yet limit the current once the commanded value is reached.

It should be noted that in this context, an "analog control system" is intended to include digitally controlled amplifiers, such as those that use digital-to-analog converters (DACs) and analog-to-digital converters (ADCs) to provide pseudo-analog control through digital circuitry, and which are able to generate hundreds or thousands of small discrete levels within a given range. For example, a 12-bit DAC can provide 4096 discrete levels, which may be referred to as "analog control" to distinguish it from bi-level or tri-level on/off control systems. Furthermore, while the known systems referenced above may use bipolar junction transistors (BJTs) or field effect transistors (FETs) to control the current in the solenoid coil 42, and while such transistors can be also used in amplifiers, or might themselves be considered amplifiers, their use in on/off circuits, such as those in the known systems, is characterized by operating the transistor in either a saturated (on) condition or in a cut-off (off) condition. This mode of operation is meaningfully distinct from the function of the amplifier 46, the flexibility and advantages of which are described herein. In amplifiers, such as the PWM transconductance amplifier 46 used in embodiments of the present disclosure, the transistors are switched rapidly back and forth between the saturated state and the cut-off state to minimize power dissipated in the transistors. However, this switching takes place at a frequency high enough that substantially all of the energy at the switching frequency and its harmonics may be filtered before reaching the load. The remaining direct current (DC) and lower frequency energy passes through the filter to the load. In this configuration, even though the transistors are utilized only in their on or off states, the function of the amplifier subsystem provides the function and virtues of an analog amplifier without the drawbacks, and in particular, without the limitations of the known on/off systems.

A significant commercial advantage of using the amplifier 46 to drive the solenoid coil 42 is realized when one recognizes that many existing dispensing machines drive the dispensing unit as a servo motor mechanism. By utilizing this existing infrastructure, deployment of the solenoid-controlled, pneumatically-driven pump to the field is greatly facilitated. The solenoid valve 44 may be connected to the same connector that normally supports a servo-driven pump, and the changes to the system to accommodate the different pump types are minimized. The use of known solenoid control systems in a system designed to also support servo-motor controlled dispensing pumps would necessitate the presence of both the amplifier for servo motor control, and also a separate solenoid coil drive system, the combination of which would be needed to support the driving of both pump types.

Further embodiments of the present disclosure are directed to a method of minimizing the differences in drop dispensing behavior between the dispensing of a first drop or first few initial drops in a sequence and the dispensing of subsequent drops in the sequence. The observation that the power dissipated in a coil varies with cycle frequency, that a temperature of the coil varies with power dissipated in the coil, that a winding resistance of the coil changes with coil temperature, and that in turn, the response of the coil may vary with the winding resistance of the coil. Reference can be made to the following:

Cycle Frequency→Power Dissipated→Coil Temperature→Winding Resistance→Solenoid Response When the coil is actuated for the first time after sitting idle for an extended period of time, the coil will be at a different temperature than it will be for subsequent drops dispensed periodically. Thus, if the coil temperature can be more closely controlled, then the response of the coil can be made to be more consistent. Embodiments of the method further include using an amplifier to drive a solenoid coil such that turn on and turn off times are faster than would be achieved with prior art drive methods.

In one embodiment, the method of the present disclosure is capable of controlling the current flow in the coil of the pneumatic solenoid valve at (virtually) any desired level. Specifically, the method includes driving a current in a coil with a PWM transconductance amplifier of a dispensing unit, which uses an input voltage to command and control a current in a load. As mentioned above, other types of amplifiers may be used to achieve the same benefit. In one embodiment, the coil of the solenoid valve is connected as the load for the amplifier, and is connected either directly to the amplifier or through intermediate filter components, such as high frequency choke inductors. With the amplifier arrangement, when the valve is not actively being actuated, the current may be controlled to flow at a low steady state level. This level may be chosen to be low enough to not actuate the valve, but yet enough to keep the coil warm. In other words, the current control is part of an analog control system, rather than the digital (on/off) control systems typically found in known coil drive systems, and this additional control is utilized to better achieve the overall system objective. The benefits of a reduced holding voltage may also be realized with the analog amplifier control.

Some known systems recognize the advantages of maintaining the temperature of a solenoid coil (see U.S. Pat. No. 8,339,762 to North). However, such known system use short pulses to dissipate some energy in the coil without energizing the solenoid to the on position.

In one method, the coil is designed for 24V, and has a resistance of about 15 ohms @25° C., resulting in a current of 1.6 Amps. When the coil warms up, the resistance will increase and the current will be reduced. A controlled actuation current of 1.4 A causes the valve to actuate at substantially the same speed as with higher currents, and thus minimizes unnecessary winding heating. Once in the actuated state, the coil will maintain its actuated position until the current is reduced below about 300 mA. Below this level, this particular coil will return to a de-energized state. Furthermore, maintaining a current at a level well below this holding current threshold will not cause the valve to return to the energized state.

There are beneficial effects of increasing the idle temperature of the coil with an idle current of about 0.1 A. This low "background" current generates enough heat to warm the coil above ambient, yet it does not interfere with normal operation of the coil. In practice, the level of the idle current required to generate the same steady-state temperature in the coil will be dependent upon ambient conditions, the thermal time constant of the coil, the normal periodic actuation rate of the coil, and other similar factors and variables.

Figure 5:
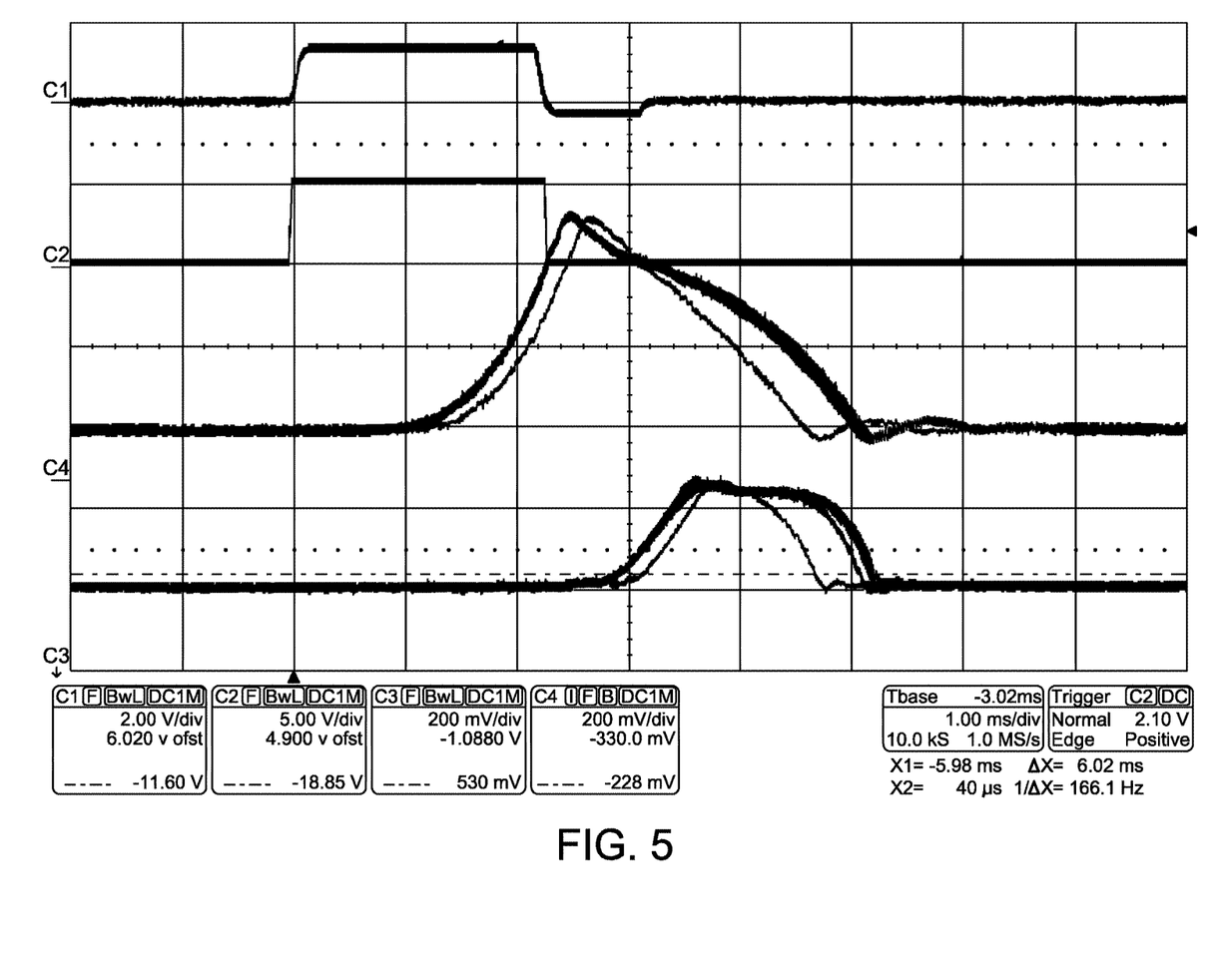
FIG. 5 is a graph showing position versus time of a dispensing unit without idle current.
Figure 6:
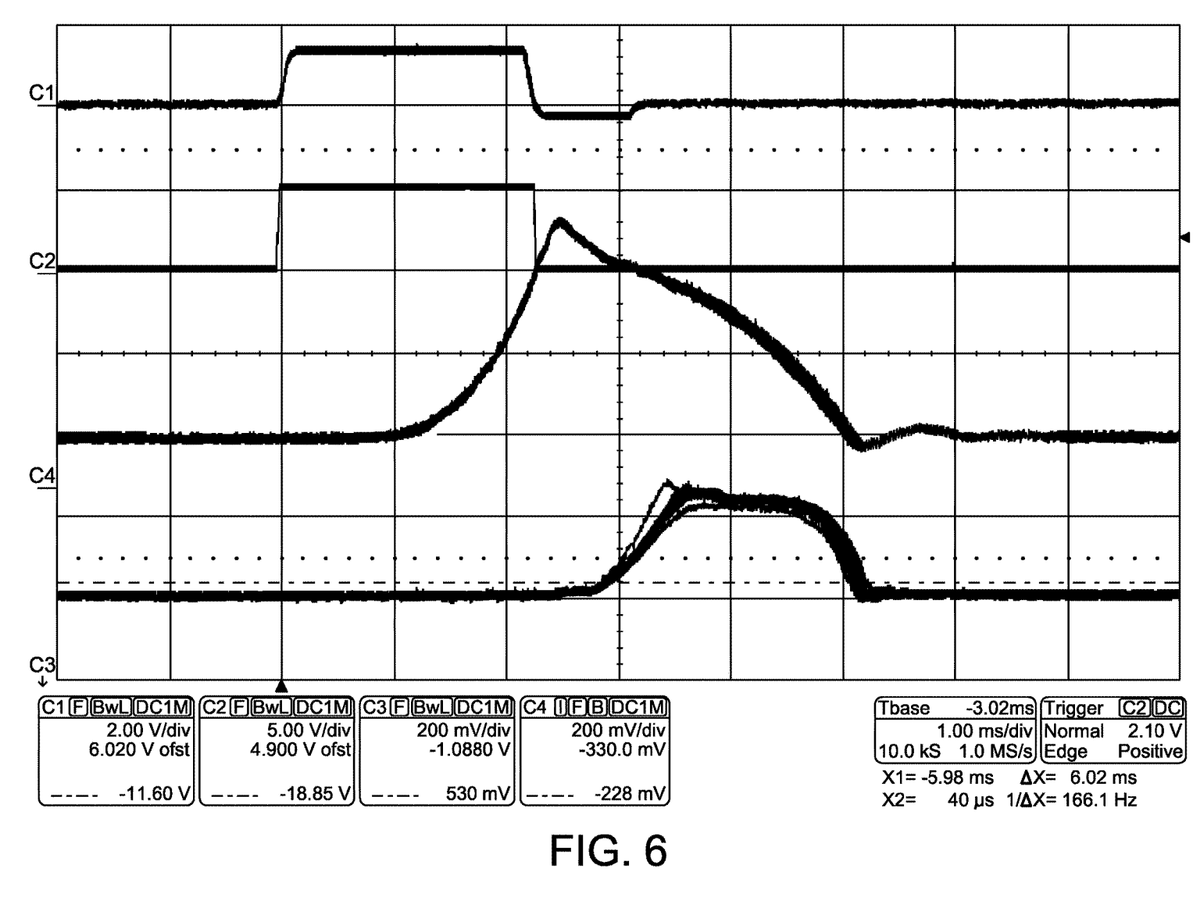
FIG. 6 is a graph showing position versus time of a dispensing unit with an idle current of 0.1 Ampere (A).

When comparing the position versus time response of a poppet in a pneumatic valve, the presence of a low level "idle current" in the coil can substantially reduce or even eliminate the difference in first actuation response. Referring to FIGS. 5 and 6, the third trace represents a motion of a solenoid poppet. It can be seen that the response of the valve in FIG. 6 is much more consistent, having corrected the separate trace seen in FIG. 5, which is due to the first pulse response.

As shown in FIGS. 5 and 6, the first trace represents current command, the second trace represents trigger, the third trace represents poppet position, and the fourth trace represents piston position. These traces were captured with a digital oscilloscope in persistence mode, with traces from ten events overlaid upon one another. As seen in the third set of traces in FIG. 5, one event response is different than the others in the set of sweeps—this is the first event after a period of inactivity (i.e., first drop). It can also be seen in the fourth trace that the piston responds differently to this change in the poppet response. In FIG. 6, idle current in the coil has been introduced, and in the third set of traces, representing the poppet response, it is apparent that all of the poppet response curves are substantially identical. The remaining slight variation in piston response is due to other sources.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of controlling a dispensing unit used to dispense material on a substrate, the method comprising:
   connecting a solenoid coil of a pneumatically-driven pump to an amplifier output of a dispensing system; and
   driving the solenoid coil with the amplifier to a cause the pneumatically-driven pump to dispense material on a substrate.

2. The method of claim 1, further comprising commanding an idle current to flow in the solenoid coil during periods of inactivity.

3. The method of claim 2, wherein the idle current is sufficient to cause warming of the solenoid coil, yet not sufficient to activate the solenoid to an engaged position.

4. The method of claim 1, further comprising
   commanding a first current level to flow in the solenoid coil to rapidly activate the solenoid, and
   commanding a second current level to flow in the solenoid coil after the solenoid is activated.

5. The method of claim 4, wherein the second current level is sufficient to maintain the solenoid in the activated state.

6. The method of claim 5, wherein the second current level is less than the first current level.

7. The method of claim 6, further comprising commanding a third current level to flow in the solenoid coil.

8. The method of claim 7, wherein the third current level is of opposite polarity than the second current level and of a magnitude sufficiently small so as not to cause the solenoid to activate.

9. The method of claim 8, further comprising commanding an idle current to flow in the solenoid coil during periods of inactivity.

10. The method of claim 9, wherein the idle current is sufficient to cause warming of the solenoid coil, yet not sufficient to activate the solenoid to an engaged position.

11. The method of claim 1, wherein the dispensing unit is configured to dispense viscous material on an electronic substrate.

* * * * *